United States Patent
Okada et al.

(10) Patent No.: US 9,797,955 B2
(45) Date of Patent: Oct. 24, 2017

(54) INSULATION INSPECTION DEVICE FOR MOTORS AND INSULATION INSPECTION METHOD FOR MOTORS

(71) Applicant: Mitsubishi Electric Corporation, Chiyoda-ku (JP)

(72) Inventors: Shinichi Okada, Chiyoda-ku (JP); Hiroki Shiota, Chiyoda-ku (JP); Hirotaka Muto, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 216 days.

(21) Appl. No.: 14/433,782

(22) PCT Filed: Apr. 17, 2013

(86) PCT No.: PCT/JP2013/061388
§ 371 (c)(1),
(2) Date: Apr. 6, 2015

(87) PCT Pub. No.: WO2014/083866
PCT Pub. Date: Jun. 5, 2014

(65) Prior Publication Data
US 2015/0247901 A1    Sep. 3, 2015

(30) Foreign Application Priority Data

Nov. 29, 2012    (JP) .................................. 2012-260580

(51) Int. Cl.
*G01R 31/34* (2006.01)
*G01R 31/02* (2006.01)
(Continued)

(52) U.S. Cl.
CPC ............. *G01R 31/34* (2013.01); *G01R 31/02* (2013.01); *G01R 31/12* (2013.01); *G01R 31/343* (2013.01);
(Continued)

(58) Field of Classification Search
CPC .... G01R 31/34; G01R 31/343; G01R 31/346; G01R 31/06; G01R 31/24; G01R 31/2635; G01R 31/44; F02P 17/00; H05B 37/03
(Continued)

(56) References Cited

U.S. PATENT DOCUMENTS

2004/0257029 A1\* 12/2004 Sakamoto ............ G01R 31/343
318/802
2006/0022679 A1\* 2/2006 Obata .................... G01R 31/06
324/551
(Continued)

FOREIGN PATENT DOCUMENTS

CN    1722597 A    1/2006
CN    1799189 A    7/2006
(Continued)

OTHER PUBLICATIONS

Office Action dated May 10, 2016 in Japanese Patent Application No. 2014-550039 (with partial English language translation).
(Continued)

*Primary Examiner* — Huy Q Phan
*Assistant Examiner* — Raul Rios Russo
(74) *Attorney, Agent, or Firm* — Oblon, McClelland, Maier & Neustadt, L.L.P.

(57) ABSTRACT

An insulation inspection device for motors includes an inverter for driving a motor, a partial discharge detecting unit for determining soundness of the motor, and a control circuit for controlling the inverter. The control circuit adjusts a switching interval of a voltage pulse of the inverter so as to be equal to a pulse round-trip propagation time between the inverter and the motor, thereby generating surge voltage higher than driving voltage for the motor, between the motor and ground, and adjusts a switching time for each phase of the inverter, thereby generating surge voltage higher than driving voltage for the motor, between phases, thus performing insulation inspection.

20 Claims, 15 Drawing Sheets

(51) Int. Cl.
    *H05B 37/03* (2006.01)
    *G01R 31/12* (2006.01)
    *H02P 29/024* (2016.01)
(52) U.S. Cl.
    CPC ...... *G01R 31/1272* (2013.01); *H02P 29/0241* (2016.02); *H05B 37/03* (2013.01)
(58) Field of Classification Search
    USPC ......... 324/71, 378, 403, 415, 425, 500, 537, 324/545, 765.01
    See application file for complete search history.

(56) References Cited

U.S. PATENT DOCUMENTS

| | | | |
|---|---|---|---|
| 2007/0200530 A1* | 8/2007 | Shimozono | H02K 11/00 318/807 |
| 2013/0033214 A1* | 2/2013 | Obata | G01R 31/1227 318/490 |
| 2014/0062525 A1* | 3/2014 | Obata | G01R 31/1272 324/765.01 |
| 2014/0354298 A1 | 12/2014 | Obata | |

FOREIGN PATENT DOCUMENTS

| | | |
|---|---|---|
| JP | 2001-141795 A | 5/2001 |
| JP | 2002-062330 A | 2/2002 |
| JP | 2005-137127 A | 5/2005 |
| JP | 2006-038688 A | 2/2006 |
| JP | 2008-306833 A | 12/2008 |
| JP | 2009-288250 A | 12/2009 |

OTHER PUBLICATIONS

International Search Report dated Jun. 25, 2013 in PCT/JP2013/061388 Filed Apr. 17, 2013.
Japanese Office Action dated Oct. 6, 2015 in Patent Application No. 2014-550039(with Partial English Translation).
Combined Chinese Office Action and Search Report dated Feb. 24, 2017 in Patent Application No. 201380059421.5 (with partial English translation and English translation of categories of cited documents).
Chinese Office Action dated Jul. 4, 2017, issued in Chinese Patent Application No. 201380059421.5 (with English translation).

* cited by examiner

FIG. 11
U-PHASE VOLTAGE
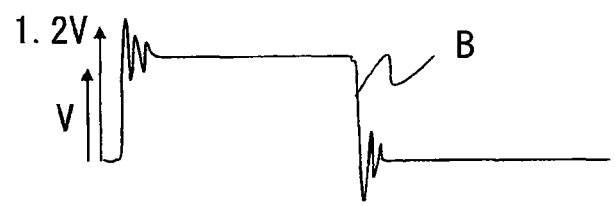

INSULATION INSPECTION DEVICE FOR MOTORS AND INSULATION INSPECTION METHOD FOR MOTORS

TECHNICAL FIELD

The present invention relates to an insulation inspection device and an insulation inspection method for inverter-driving motors.

BACKGROUND ART

In a motor, when an insulation property reduces due to aged deterioration or the like of an insulating material, partial discharge occurs, whereby deterioration of the insulating material is promoted, eventually resulting in dielectric breakdown. It is required that partial discharge start voltage is higher than driving voltage for a motor. Therefore, in order to detect reduction in insulation performance at an early stage, it is necessary to perform insulation inspection by applying overvoltage equal to or higher than the driving voltage. A method and a device for performing partial discharge test for a motor, using an inverter for motor driving, without using a dedicated inspection device, are disclosed (for example, Patent Document 1).

CITATION LIST

Patent Document

Patent Document 1: Japanese Laid-Open Patent Publication No. 2005-137127 (paragraphs [0014] to [0017] and FIG. 1)

SUMMARY OF THE INVENTION

Problems to be Solved by the Invention

The invention disclosed in Patent Document 1 measures occurrence of partial discharge, using driving voltage for a motor. Therefore, as deterioration of an insulating material progresses, when partial discharge start voltage has reduced to the driving voltage for the motor (low-voltage motor) or when an electric charge amount in partial discharge has reached a prescribed value or greater (high-voltage motor), deterioration of the insulating material is detected. Therefore, there is a problem that a time from detection of deterioration to failure of the motor is short, repair or exchange of the motor cannot be performed, and the motor must be stopped.

The present invention has been made to solve the above problem, and an object of the present invention is to provide an insulation inspection device and an insulation inspection method for motors, which are capable of easily detecting insulation deterioration of a motor at an early stage by applying voltage equal to or higher than driving voltage for the motor, without the need of a dedicated inspection device.

Solution to the Problems

An insulation inspection device for motors according to the present invention includes: an inverter for driving a motor; a partial discharge detecting unit for detecting partial discharge in the motor and determining soundness of the motor; and a control circuit for controlling the inverter, wherein the control circuit controls the inverter to adjust a switching interval of a voltage pulse so as to be equal to a pulse round-trip propagation time between the inverter and the motor, thereby generating surge voltage higher than driving voltage for the motor, between the motor and ground.

An insulation inspection method for motors according to the present invention uses an insulation inspection device for motors including an inverter for driving a motor, a partial discharge detecting unit for determining soundness of the motor, and a control circuit for controlling the inverter, and the insulation inspection method includes: a first step of setting a value of test voltage to be applied to the motor; a second step of the control circuit adjusting a switching interval of a voltage pulse of the inverter so as to be equal to a pulse round-trip propagation time between the inverter and the motor, in order to set, to the test voltage, surge voltage that is to be generated between the motor and ground and is higher than driving voltage for the motor; a third step of the inverter applying the test voltage between each phase and ground; and a fourth step of the partial discharge detecting unit detecting a partial discharge signal and determining soundness of the motor with respect to ground.

Effect of the Invention

Owing to the above configuration, the insulation inspection device for motors according to the present invention can provide an insulation inspection device for motors, which is capable of easily detecting insulation deterioration of a motor at an early stage by applying voltage equal to or higher than driving voltage for the motor, without the need of a dedicated inspection device.

Owing to the above steps, the insulation inspection method for motors according to the present invention can provide an insulation inspection method for motors, which is capable of easily detecting insulation deterioration of a motor at an early stage by applying voltage equal to or higher than driving voltage for the motor, without the need of a dedicated inspection device.

BRIEF DESCRIPTION OF THE DRAWINGS

FIG. 11 is a diagram of surge voltage, according to the insulation inspection device for motors of embodiment 2 of the present invention.

DESCRIPTION OF EMBODIMENTS

Embodiment 1

Embodiment 1 relates to an insulation inspection device for motors including an inverter for driving a motor, a partial discharge detecting unit for determining soundness of the motor, and a control circuit for controlling the inverter, wherein the control circuit adjusts a switching interval of the inverter so as to be equal to a pulse round-trip propagation time between the inverter and the motor, thereby generating voltage to ground higher than surge voltage in driving, thus performing insulation inspection. In addition, in the insulation inspection device for motors, the control circuit adjusts a switching time for each phase of the inverter, thereby generating phase-to-phase voltage higher than surge voltage in driving of the motor, thus performing insulation inspection.

Hereinafter, the configuration and operation of an insulation inspection device 1 for motors according to embodiment 1 of the present invention will be described based on FIGS. 1 and 8 which are configuration diagrams of the insulation inspection device for motors, FIG. 2 which is a diagram of surge voltage, FIGS. 3 and 4 which are diagrams of surge voltage between phases, FIG. 5 which is a diagram of surge voltage with respect to ground, FIG. 6 which is a principle diagram of surge voltage generation, FIG. 7 which is an explanation diagram for surge voltage generation, and FIG. 9 which is an explanation diagram for partial discharge detection.

Figure 1:
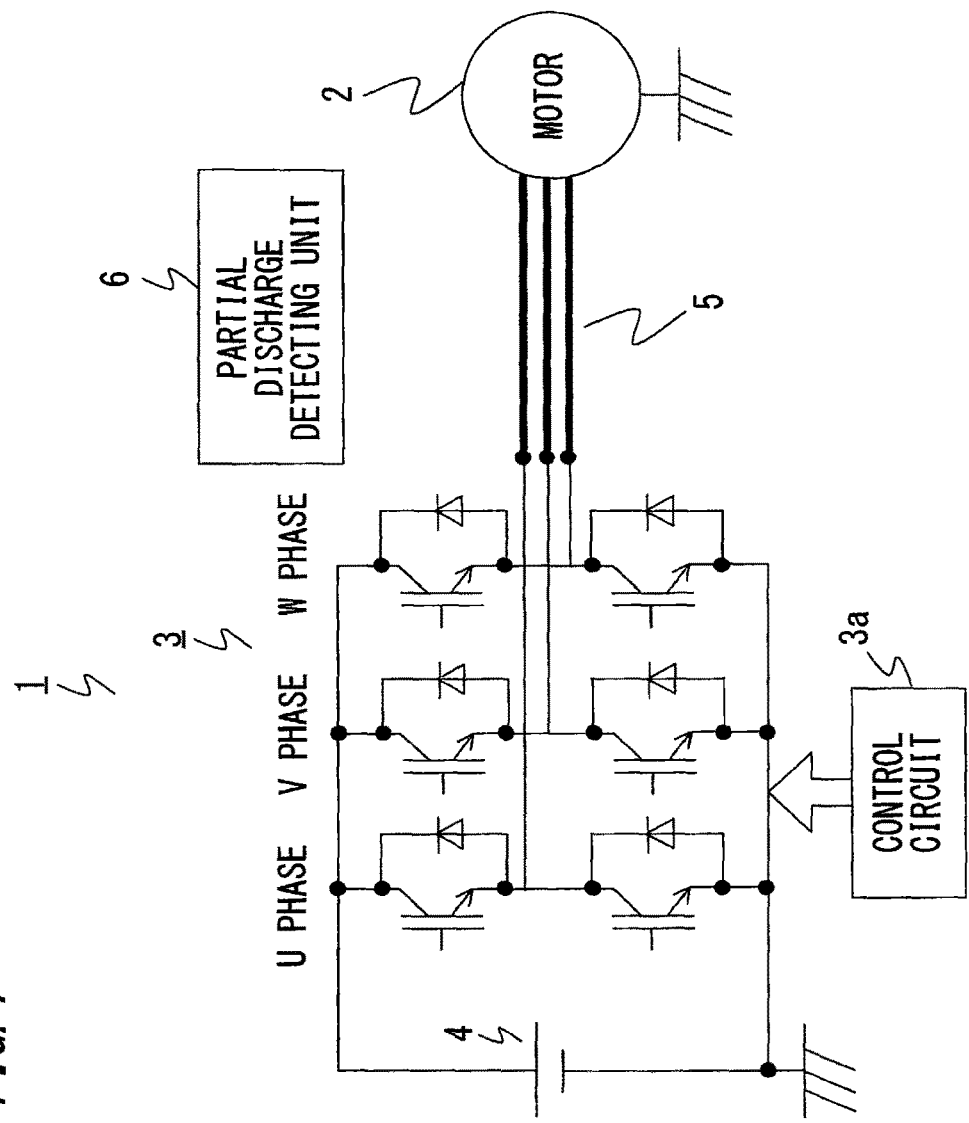
FIG. 1 is a configuration diagram according to an insulation inspection device for motors of embodiment 1 of the present invention.

FIG. 1 shows the configuration of the insulation inspection device 1 for motors using an inverter, according to embodiment 1 of the present invention.

In FIG. 1, an insulation inspection system for motors is composed of the insulation inspection device 1 for motors and a motor 2 which is an insulation inspection target. The insulation inspection device 1 for motors is composed of an inverter 3 of three-phase (U, V, and W phases) driven type, which drives the motor 2 and generates test voltage (surge voltage) for insulation inspection which will be described in detail later, a control circuit 3a which controls switching of a switching element in the inverter 3, a DC power supply 4, a cable 5 for driving of the motor 2, which is provided between the motor 2 and the inverter 3, and a partial discharge detecting unit 6 which detects partial discharge in the insulation inspection, to determine soundness of the motor 2.

Although the DC power supply 4 is used as a driving power supply for the inverter 3 in FIG. 1, a configuration in which an AC power supply is converted to DC voltage by a rectification circuit may be used.

First, a voltage pulse at an inverter 3 end and a voltage pulse at a motor 2 end in the case where the control circuit 3a controls the inverter 3 and the motor 2 is driven by the inverter 3 will be described based on FIG. 2.

In the following description, voltage for the inverter 3 to drive the motor 2 during normal operation is denoted by V.

Figure 2:
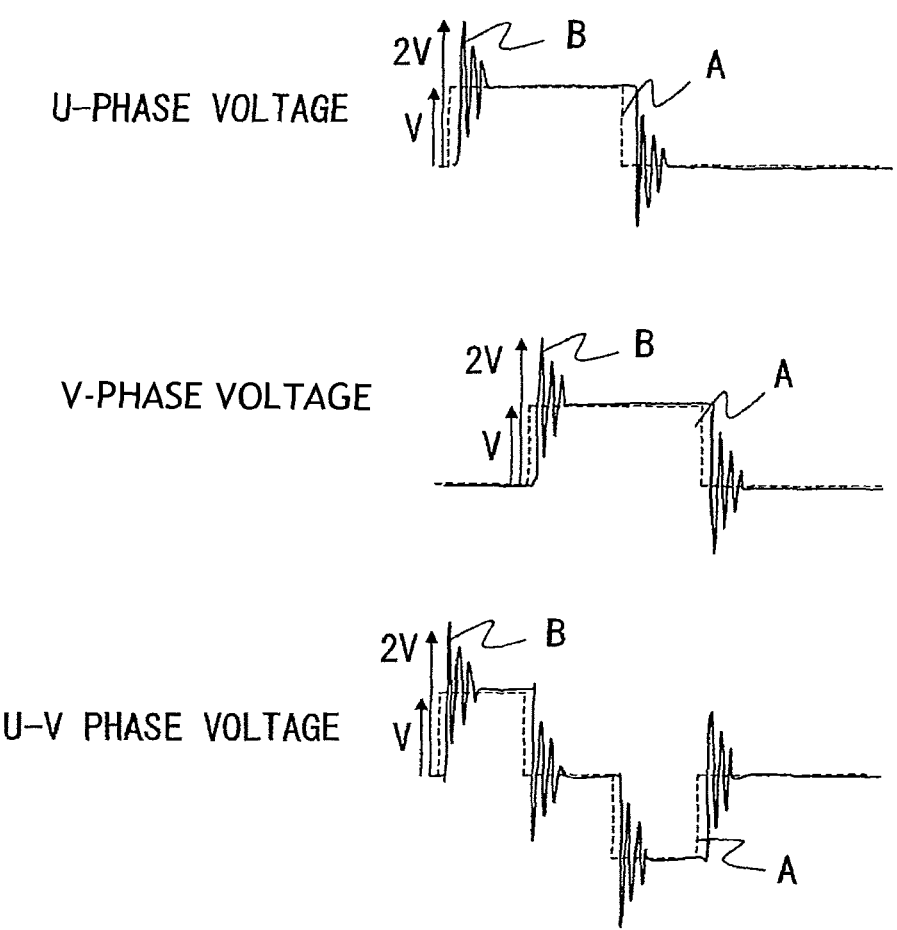
FIG. 2 is a diagram of surge voltage, according to the insulation inspection device for motors of embodiment 1 of the present invention.

FIG. 2 shows voltage pulse waveforms of U-phase voltage, V-phase voltage, and voltage between U phase and V phase. In FIG. 2, a dotted line (A) indicates a voltage pulse waveform (inverter-end voltage pulse) at the inverter 3 end, and a solid line (B) indicates a voltage pulse waveform (motor-end voltage pulse) at the motor 2 end.

Generally, cable impedance is smaller than motor impedance, and when a rising time of a voltage pulse of inverter output becomes equal to or shorter than a pulse round-trip propagation time in the cable, surge voltage two times as high as the voltage pulse at the inverter 3 end is generated at the motor 2 end, as shown in FIG. 2.

Next, the case of generating surge voltage between phases will be described using U phase and V phase as an example, based on FIG. 3 and FIG. 4. In FIG. 3 and FIG. 4, A indicates an inverter-end voltage pulse and B indicates a motor-end voltage pulse.

Figure 3:
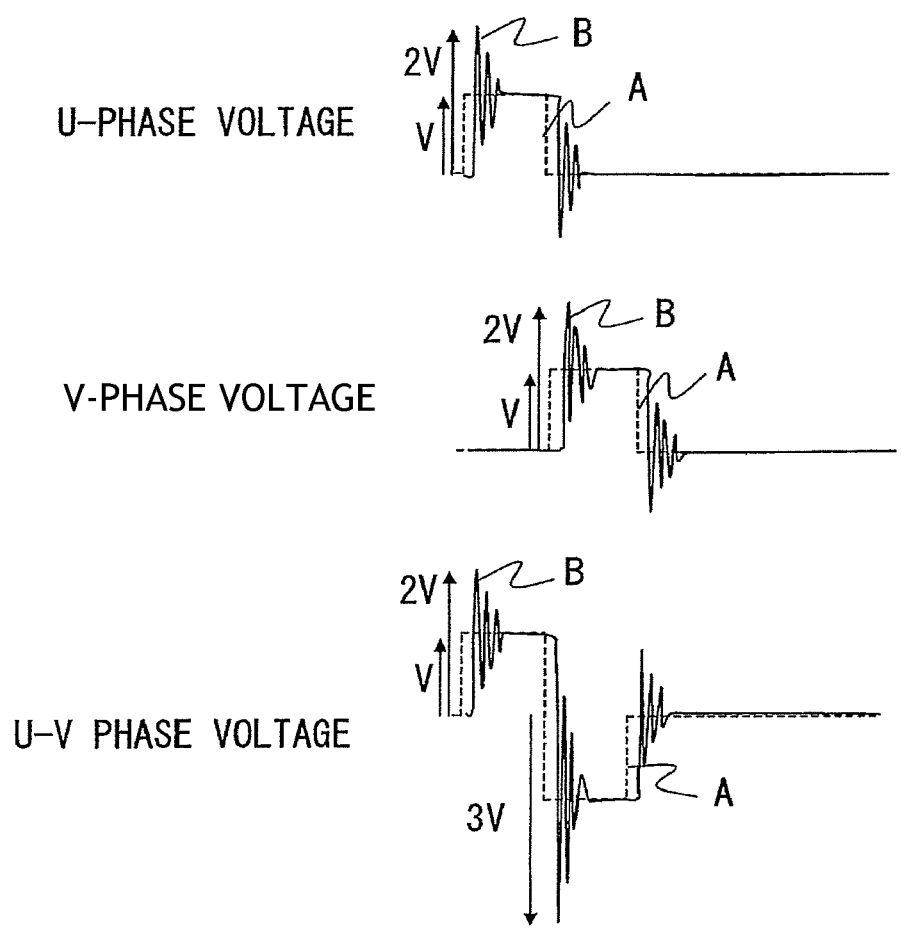
FIG. 3 is a diagram of surge voltage between phases, according to the insulation inspection device for motors of embodiment 1 of the present invention.

In FIG. 3, the control circuit 3a performs switching for U phase and V phase of the inverter 3 simultaneously. Specifically, at a timing to turn off U phase from on, V phase is turned on from off.

Thus, by switching U phase and V phase simultaneously, U-phase surge voltage and V-phase surge voltage are superimposed on each other, whereby voltage of 3V can be generated between U phase and V phase. Although FIG. 3 shows the case of generating surge voltage of 3V at a negative side, it is also possible to generate surge voltage of 3V at a positive side by reversing on and off of switching for U phase and switching for V phase.

Next, in FIG. 4, the case where switching for U phase and switching for V phase of the inverter 3 are not simultaneous but shifted from each other will be described.

Figure 4:
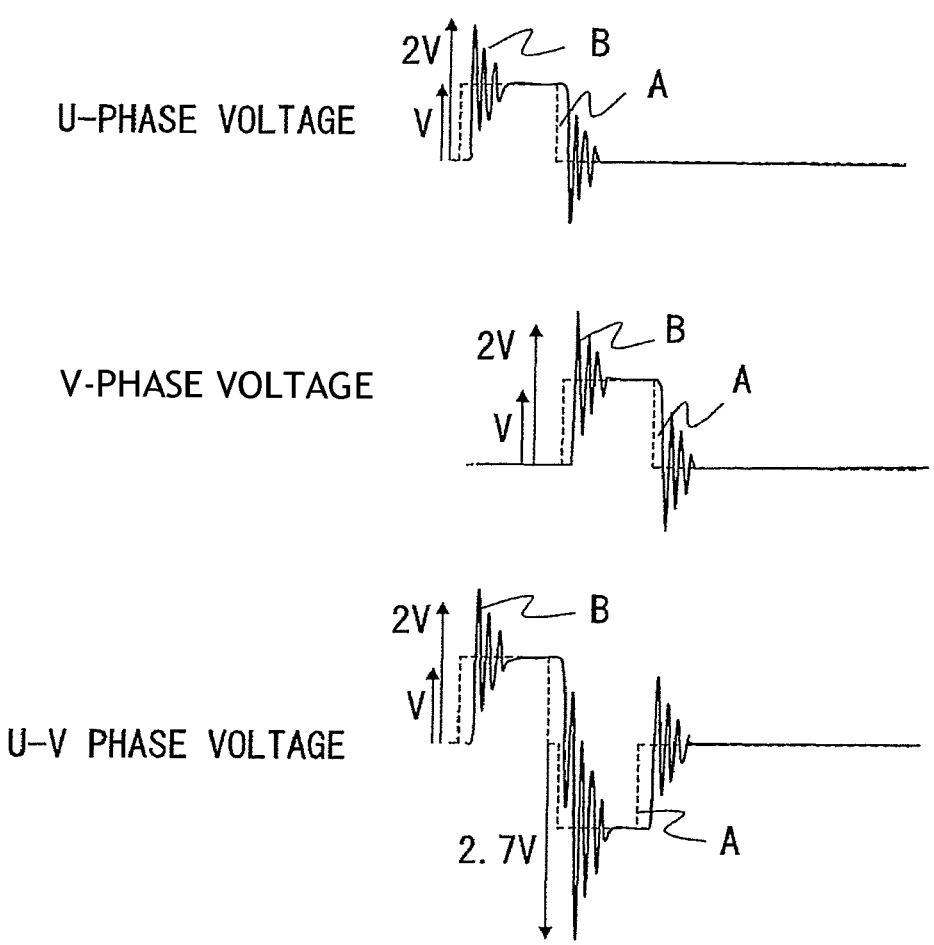
FIG. 4 is a diagram of surge voltage between phases, according to the insulation inspection device for motors of embodiment 1 of the present invention.

As shown in FIG. 4, by shifting switching times for U phase and V phase from each other, surge voltage lower than 3V can be generated between the phases. In the example of FIG. 4, surge voltage of 2.7V is generated between U phase and V phase.

Thus, by shifting times of switching, it is possible to arbitrarily generate surge voltage of 2V to 3V exceeding surge voltage in driving.

Next, the case of generating surge voltage with respect to ground will be described using U phase as an example, based on FIG. 5 and FIG. 6.

Figure 5:
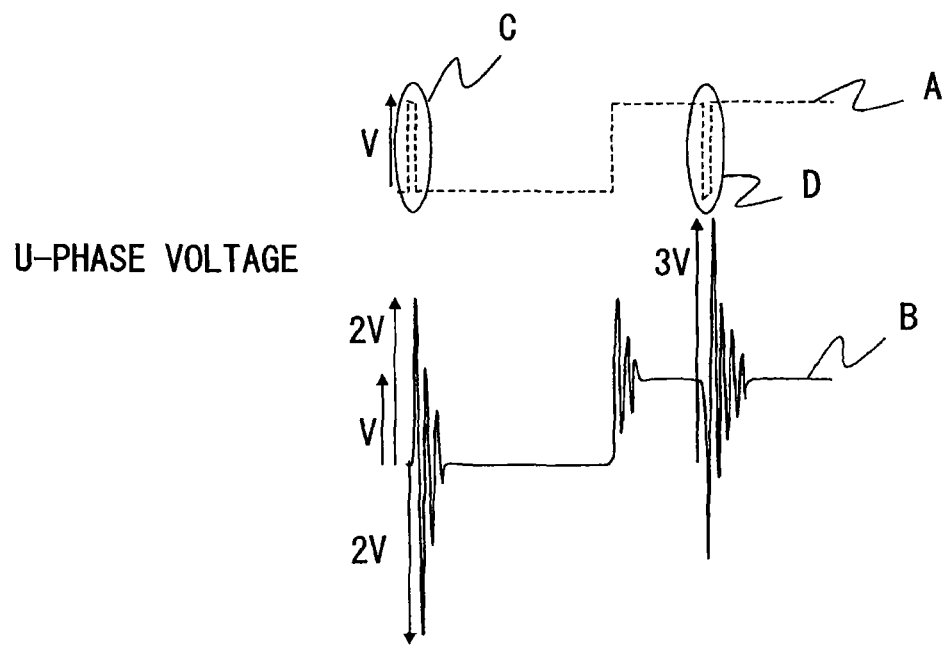
FIG. 5 is a diagram of surge voltage with respect to ground, according to the insulation inspection device for motors of embodiment 1 of the present invention.

FIG. 5 shows a voltage waveform when surge voltage of 3V is generated between U phase and ground based on a generation principle described later. In FIG. 5, A indicates an inverter-end voltage pulse and B indicates a motor-end voltage pulse. In addition, C indicates first adjustment for switching interval and D indicates second adjustment for switching interval.

In the first adjustment for switching interval, at the inverter end, U phase is switched on from off, and then after a pulse round-trip propagation time has elapsed, switched off. In the second adjustment for switching interval, at the inverter end, U phase is switched off from on, and then after a pulse round-trip propagation time has elapsed, switched on.

By making the switching interval of each switching element in the inverter equal to the pulse round-trip propagation time in the cable, it is possible to generate surge voltage of 2V (normally, 1V) at a negative side in the first adjustment for switching interval, and generate surge voltage of 3V at a positive side in the second adjustment for switching interval.

Figure 6:
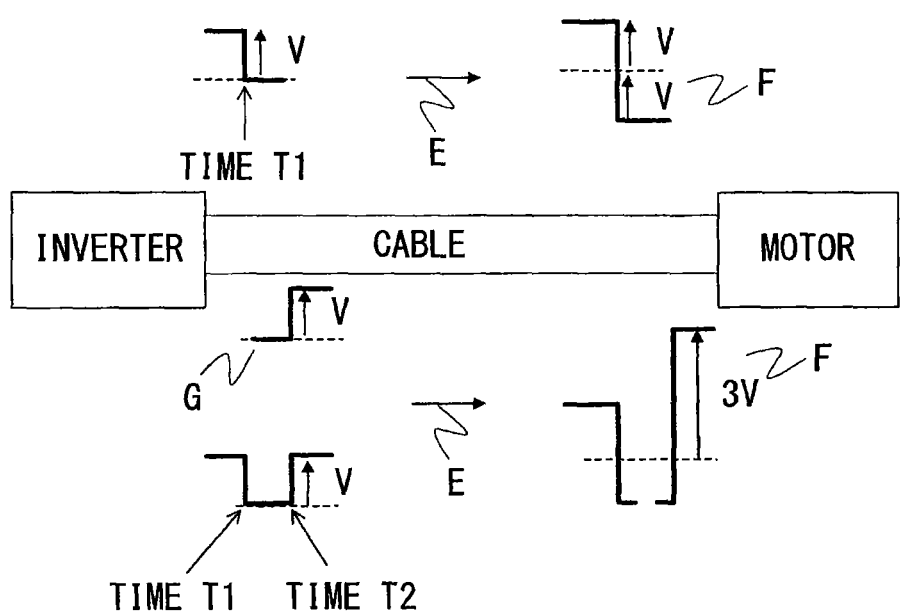
FIG. 6 is a principle diagram of surge voltage generation, according to the insulation inspection device for motors of embodiment 1 of the present invention.

FIG. 6 shows explanation of a generation principle of the surge voltage (3V) with respect to ground. FIG. 6 is an explanation diagram according to the second adjustment for switching interval. In FIG. 6, E indicates propagation to the motor side, F indicates surge voltage, and G indicates a reflection wave from the motor end.

When switching (from on to off) is performed at time T1, a voltage pulse propagates to the motor end. When the voltage pulse has reached the motor end, since the impedance of the motor is greater than the impedance of the cable, surge occurs and the voltage pulse is reflected to the inverter end. When the voltage pulse has reached the inverter end, since the impedance of the cable is greater than the impedance of the inverter end, the polarity of the voltage pulse is inverted and the inverted voltage pulse is reflected to the motor end. At this time (time T2), the inverter element is switched (from off to on), whereby the reflection wave and a voltage pulse of inverter output propagate to the motor end simultaneously.

When the reflection wave and the voltage pulse have reached the motor end, surge occurs for voltage of 2V due to the reflection wave and the voltage pulse, whereby voltage change by 4V occurs. At this time, voltage of 3V is generated, using 0V as a reference.

Generation of surge voltage of 3V can be realized by making the switching interval (time difference between time T1 and time T2) equal to the pulse round-trip propagation time. In addition, by making the switching interval equal to or shorter than the pulse round-trip propagation time, it is possible to generate arbitrary surge voltage of 2V to 3V at the motor end.

Figure 7:
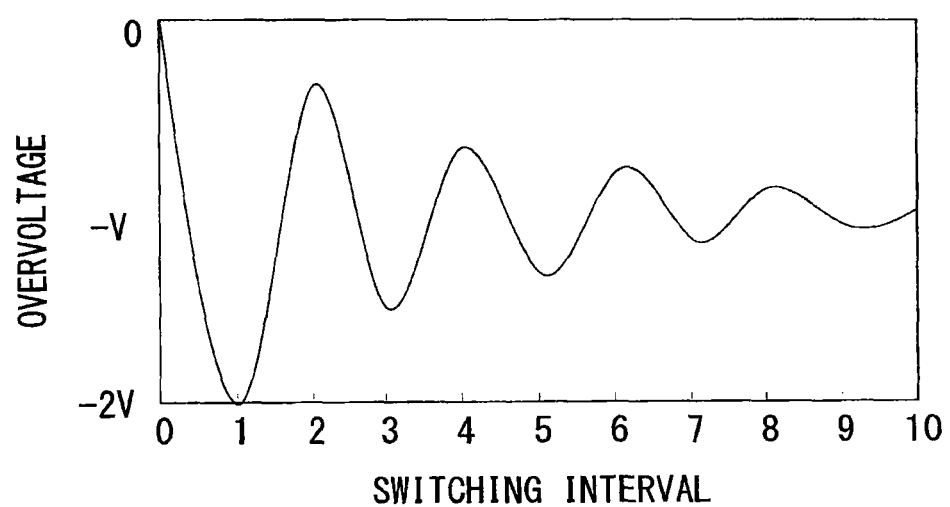
FIG. 7 is an explanation diagram for surge voltage generation, according to the insulation inspection device for motors of embodiment 1 of the present invention.

FIG. 7 shows the relationship between the switching interval and the surge voltage. In FIG. 7, each numerical value 1 of the switching interval (time difference between time T1 and time T2) indicates a pulse round-trip propagation time. A switching interval 1 corresponds to one pulse round-trip propagation time, and a switching interval 2 corresponds to two pulse round-trip propagation times. Thus, by adjusting the switching interval, it is possible to generate arbitrary surge voltage. It is noted that, since a reflection wave of a voltage pulse is attenuated, the actual surge voltage does not reach −2V.

It is noted that FIG. 7 corresponds to the first adjustment for switching interval in FIG. 5. In the case of the second adjustment for switching interval, a peak value of surge voltage is +3V.

Although FIG. 5 to FIG. 7 are for explaining surge voltage between each phase and ground, it is possible to generate higher surge voltage between U phase and V phase by performing switching of the switching elements for two phases, e.g., U phase and V phase simultaneously and making the switching intervals equal to the pulse round-trip propagation time in the cable.

For example, a voltage pulse based on the first adjustment for switching interval is generated for U phase, and at the same time, a voltage pulse based on the second adjustment for switching interval is generated for V phase, whereby surge voltage of 5V can be generated between U phase and V phase.

That is, by adjusting the switching intervals of voltage pulses for two phases of the inverter so as to be equal to the pulse round-trip propagation time and reversing positive and negative polarities of the voltage pulses between the two phases, it is possible to generate, between the phases, surge voltage up to five times higher than driving voltage for the motor, higher than the surge voltage in driving of the motor.

Next, an insulation inspection method for the motor 2 in the case where the above-described surge voltage between phases or with respect to ground is applied to the motor 2 will be described based on FIGS. 8 and 9. In FIG. 9, H indicates current flowing in a test subject and I indicates partial discharge current.

In the present embodiment, as an example of the insulation inspection method for the motor 2, partial discharge when surge voltage is applied is detected, whereby soundness of the motor 2 is determined.

Figure 8:
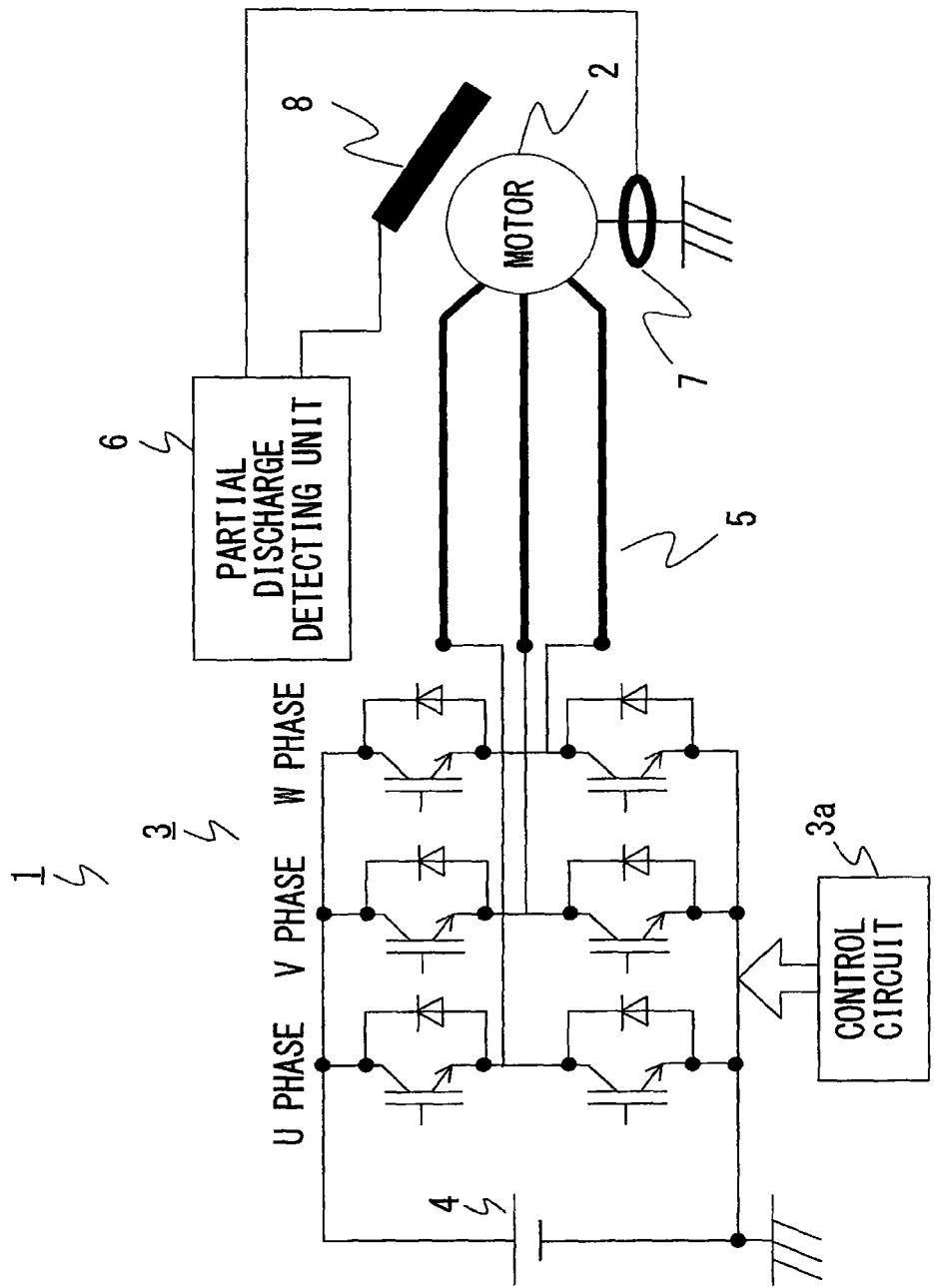
FIG. 8 is a configuration diagram according to the insulation inspection device for motors of embodiment 1 of the present invention.

FIG. 8 shows a configuration in which a current sensor 7 and an antenna 8 are added as a detector for detecting a signal of partial discharge in the motor 2 in the configuration diagram shown in FIG. 1.

Signals from the current sensor 7 and the antenna 8 are inputted to the partial discharge detecting unit 6, in which signal processing is performed, whereby partial discharge is detected.

By determining whether or not partial discharge occurs in the motor 2 when surge voltage of 2V to 3V with respect to ground or surge voltage of 2V to 5V between phases is applied, it is possible to inspect soundness of insulation in the motor 2. Whether or not partial discharge occurs can be determined through current measurement by the current sensor 7 or the like, or measurement of an electromagnetic wave radiated upon occurrence of partial discharge, by the antenna 8.

A rising time of surge voltage in the insulation inspection is short and charge current flows in the motor 2, so that the charge current is superimposed on a partial discharge signal measured by the current sensor 7. In addition, also for the antenna 8, an electromagnetic wave radiated due to the charge current is superimposed on a partial discharge signal. Therefore, the partial discharge detecting unit 6 performs high-pass filter processing to detect only a high-frequency partial discharge signal.

Figure 9:
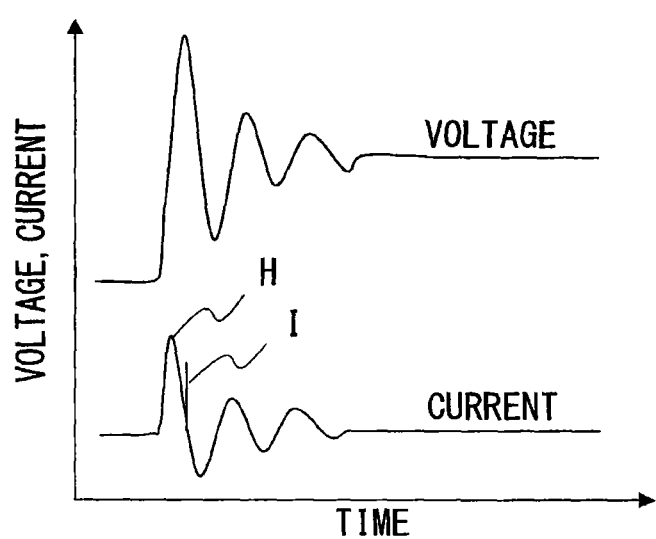
FIG. 9 is an explanation diagram for partial discharge detection, according to the insulation inspection device for motors of embodiment 1 of the present invention.

Specifically, as shown in FIG. 9, in the case of detecting a partial discharge signal under surge voltage, current flows when the surge is applied to the test subject, and an electromagnetic wave is radiated by the current. Since the rising is quick, comparatively large current flows.

Faint partial discharge current detected by the current sensor 7 is superimposed on the current flowing at the time of the rising. In addition, an electromagnetic wave detected by the antenna 8 is superimposed on an electromagnetic wave radiated by the current flowing at the time of the rising. Therefore, only a high-frequency partial discharge component is extracted by the high-pass filter.

Although the insulation inspection device 1 for motors of embodiment 1 uses both of the current sensor 7 and the antenna 8 for detection of partial discharge, only one of them may be used.

As described above, the insulation inspection device 1 for motors of embodiment 1 includes an inverter for driving a motor, a partial discharge detecting unit for determining soundness of the motor, and a control circuit for controlling the inverter, wherein the control circuit adjusts a switching interval of the inverter so as to be equal to a pulse round-trip propagation time between the inverter and the motor, thereby generating voltage to ground up to three times higher than driving voltage for the motor, higher than surge voltage in driving, and in addition, the control circuit adjusts a switching time for each phase of the inverter, thereby generating phase-to-phase voltage up to three times higher than driving voltage for the motor, higher than surge voltage in driving of the motor, thus performing insulation inspection. Therefore, the insulation inspection device 1 for motors can easily detect insulation deterioration of a motor at an early stage by applying voltage equal to or higher than driving voltage for the motor, without the need of a dedicated inspection device.

In addition, the insulation inspection device 1 for motors of embodiment 1 adjusts switching intervals of voltage pulses for two phases of the inverter so as to be equal to a pulse round-trip propagation time, and reverses positive and negative polarities of the voltage pulses between the two phases, thereby generating, between the two phases, surge voltage up to five times higher than driving voltage for the motor, higher than the surge voltage in driving of the motor.

Embodiment 2

An insulation inspection device for motors of embodiment 2 additionally includes a circuit for, when a rising time of a voltage pulse of the inverter is long, shortening the rising time.

Figure 10:
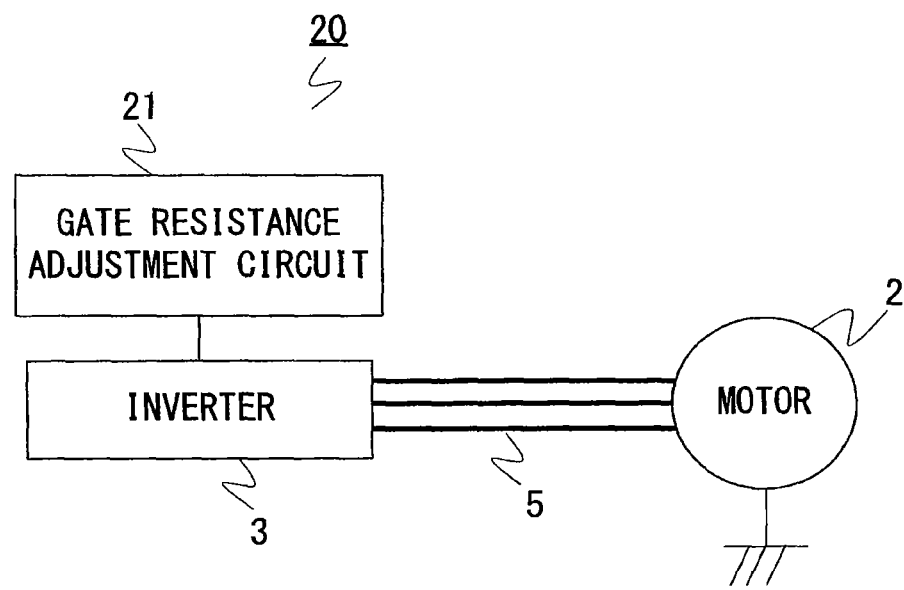
FIG. 10 is a major part configuration diagram according to an insulation inspection device for motors of embodiment 2 of the present invention.

Hereinafter, the configuration and operation of the insulation inspection device for motors of embodiment 2 will be described focusing on the difference, based on FIG. 10 which is a major part configuration diagram of an insulation inspection device 20 for motors, FIG. 11 which is a diagram of surge voltage, and FIG. 12 which is an explanation diagram for surge voltage.

First, the configuration of the insulation inspection device 20 for motors of embodiment 2 will be described based on FIG. 10. It is noted that in FIG. 10, only components necessary for the explanation are shown, and components that are the same as or correspond to those in FIG. 1 and FIG. 8 are denoted by the same reference characters. In FIG. 11, A indicates an inverter-end voltage pulse and B indicates a motor-end voltage pulse.

A difference from the insulation inspection device 1 for motors of embodiment 1 is that a gate resistance adjustment circuit 21 is added.

In embodiment 1, the description has been given under the assumption that a rising time of a voltage pulse of the inverter is short, that is, shorter than a pulse round-trip propagation time between the inverter 3 and the motor 2.

Surge voltage generated in the case where a rising time of a voltage pulse of the inverter is long will be described with reference to FIG. 11 and FIG. 12.

FIG. 11 shows surge voltage at the motor 2 end in the case where a rising time of a voltage pulse of the inverter 3 is long, using U phase as an example. In the case where a rising time of the voltage pulse is longer than a cable propagation round-trip time of the voltage pulse, based on the principle of surge generation shown in FIG. 6, a voltage pulse with an inverted polarity, reflected from the inverter 3, reaches the motor 2 end before the surge at the motor 2 end reaches the two-fold value. Therefore, the surge voltage is lower than 2V. In FIG. 11, surge voltage of 1.2V is generated.

Figure 12:
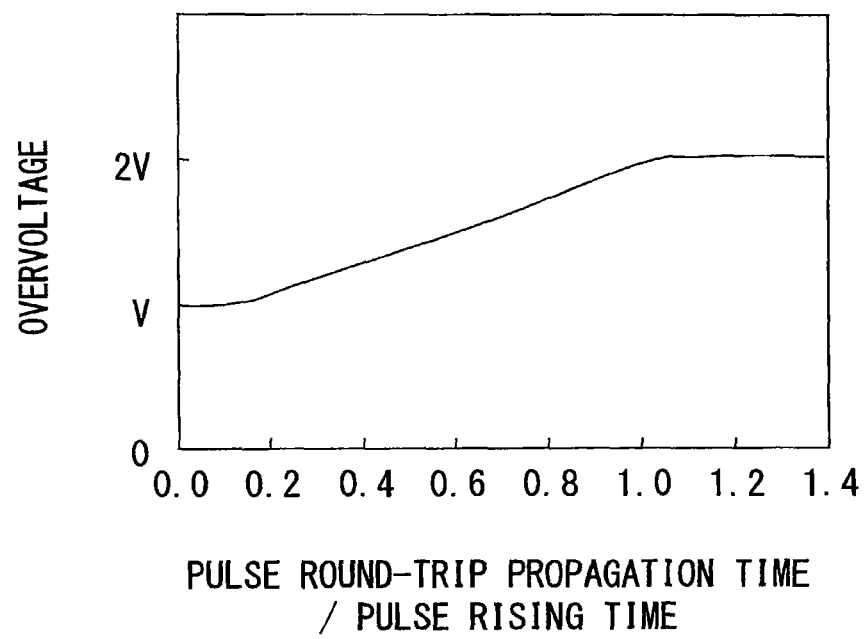
FIG. 12 is an explanation diagram for surge voltage, according to the insulation inspection device for motors of embodiment 2 of the present invention.

FIG. 12 shows the relationship between generated surge voltage, and pulse round-trip propagation time/pulse rising time. The surge voltage is determined depending on the ratio of the pulse round-trip propagation time and the pulse rising time, and varies in a range from 1V to 2V.

Therefore, in the case where rising of a pulse of the inverter of the insulation inspection device for motors is slow, surge voltage needed for insulation inspection cannot be generated. Therefore, in the insulation inspection device 20 for motors of embodiment 2, the gate resistance adjustment circuit 21 is provided to hasten rising of a pulse of the inverter.

Specifically, a terminal for connecting a resistor in parallel with a gate resistor of each switching element in the inverter 3 is provided, and in insulation inspection, a rising time of a voltage pulse is adjusted to be equal to or shorter than the pulse round-trip propagation time, whereby surge voltage of 2V can be generated at the motor 2 end.

In the case where rising of a voltage pulse of the inverter is slow, by adding the gate resistance adjustment circuit 21 of embodiment 2, it is possible to make the rising time of the voltage pulse equal to or shorter than the pulse round-trip propagation time. Therefore, the insulation inspection described in embodiment 1 can be performed.

In the case where the rising time of a voltage pulse of the inverter 3 cannot be made equal to or shorter than the pulse round-trip propagation time, the cable 5 between the inverter 3 and the motor 2 may be elongated, whereby the pulse round-trip propagation time can be made longer than the rising time of the voltage pulse.

As described above, the insulation inspection device 20 for motors of embodiment 2 additionally includes the gate resistance adjustment circuit 21, and thereby, in the case where rising of a voltage pulse of the inverter is slow, can make the rising time of the voltage pulse equal to or shorter than the pulse round-trip propagation time. Therefore, the insulation inspection device 20 for motors can perform the insulation inspection described in embodiment 1.

Therefore, it is possible to easily detect insulation deterioration of a motor at an early stage by applying voltage equal to or higher than driving voltage for the motor, without the need of a dedicated inspection device.

Embodiment 3

An insulation inspection device for motors of embodiment 3 newly includes an insulation inspection setting unit for storing insulation inspection data to execute insulation inspection, in the insulation inspection device 1 for motors of embodiment 1.

Hereinafter, the configuration and operation of an insulation inspection device 30 for motors of embodiment 3 will be described focusing on the difference, based on FIG. 13 which is a configuration diagram of the insulation inspection device 30 for motors.

Figure 13:
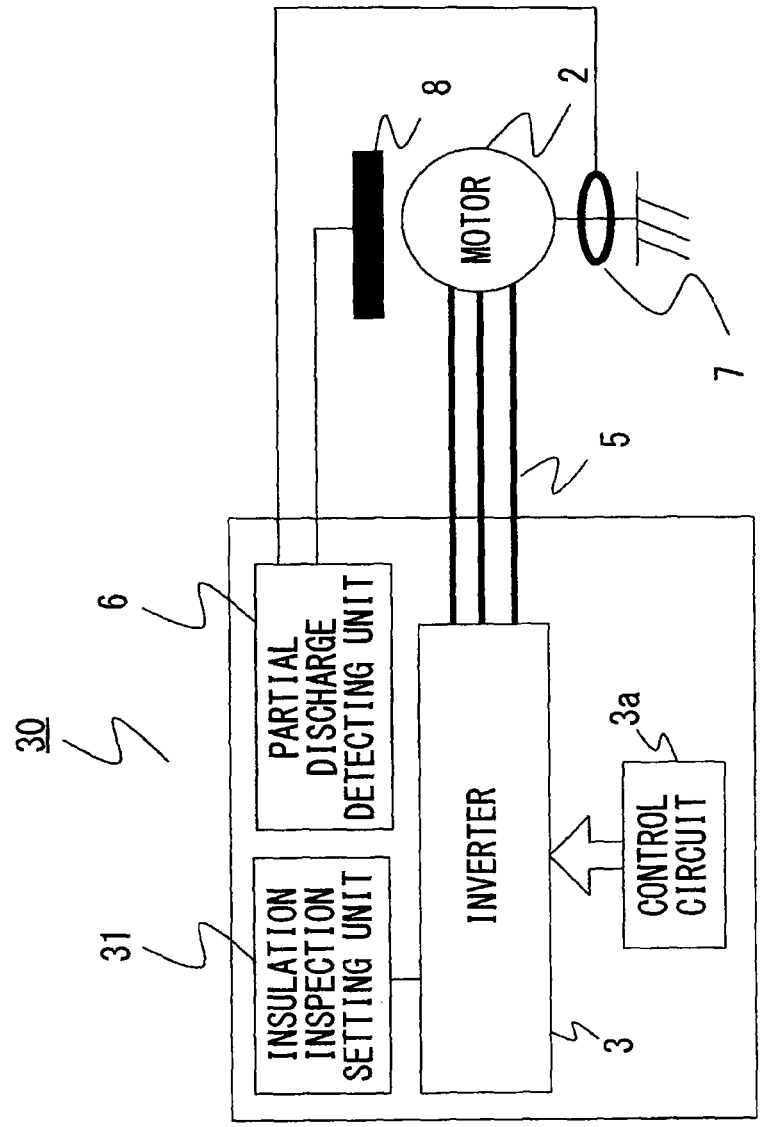
FIG. 13 is a configuration diagram according to an insulation inspection device for motors of embodiment 3 of the present invention.

In FIG. 13, components that are the same as or correspond to those in FIG. 1 and FIG. 8 are denoted by the same reference characters.

The difference between the insulation inspection device 30 for motors of embodiment 3 and the insulation inspection device 1 for motors of embodiment 1 is that an insulation inspection setting unit 31 is newly provided.

Owing to the provided insulation inspection setting unit 31, the insulation inspection device 30 for motors can store data of driving voltage for a motor, the pulse round-trip propagation time between the inverter and the motor, and a procedure of the inspection. When performing insulation inspection, the insulation inspection device 30 for motors reads the stored data, and thereby can automatically perform insulation inspection using specified test voltage (surge voltage).

In addition, in the insulation inspection device 30 for motors, the value of surge voltage to be applied, the mode to be applied (phase-to-phase voltage or voltage to ground), and the test procedure are set from the outside in accordance with the operation condition and record of the motor 2. Therefore, a burden on a maintenance person can be reduced and more appropriate insulation inspection can be performed.

Further, inspection data of the insulation inspection can be stored in the insulation inspection setting unit 31. By taking out and analyzing the inspection data as necessary, it is possible to effectively utilize the inspection data for routine/regular inspection or life prediction for the motor.

As described above, the insulation inspection device for motors of embodiment 3 newly includes the insulation inspection setting unit in the insulation inspection device for motors of the above embodiment. Therefore, the insulation inspection device for motors of embodiment 3 can automate insulation inspection and can easily perform insulation inspection more appropriately, as well as providing the effect of embodiment 1. Further, the life of the motor can be prolonged, whereby effects of saving energy and saving inspection work are obtained.

Embodiment 4

Embodiment 4 relates to an insulation inspection method for motors using an insulation inspection device for motors which includes an inverter for driving a motor, a partial discharge detecting unit for determining soundness of the motor, and a control circuit for controlling the inverter, wherein the control circuit adjusts a switching interval of the inverter so as to be equal to a pulse round-trip propagation time between the inverter and the motor in order to generate voltage to ground up to three times higher than driving voltage for the motor, higher than surge voltage in driving, thus performing insulation inspection. In addition, the insulation inspection method for motors performs insulation inspection by adjusting a switching time for each phase of the inverter in order to generate phase-to-phase voltage up to three times higher than driving voltage for the motor, higher than surge voltage in driving of the motor.

Figure 14:
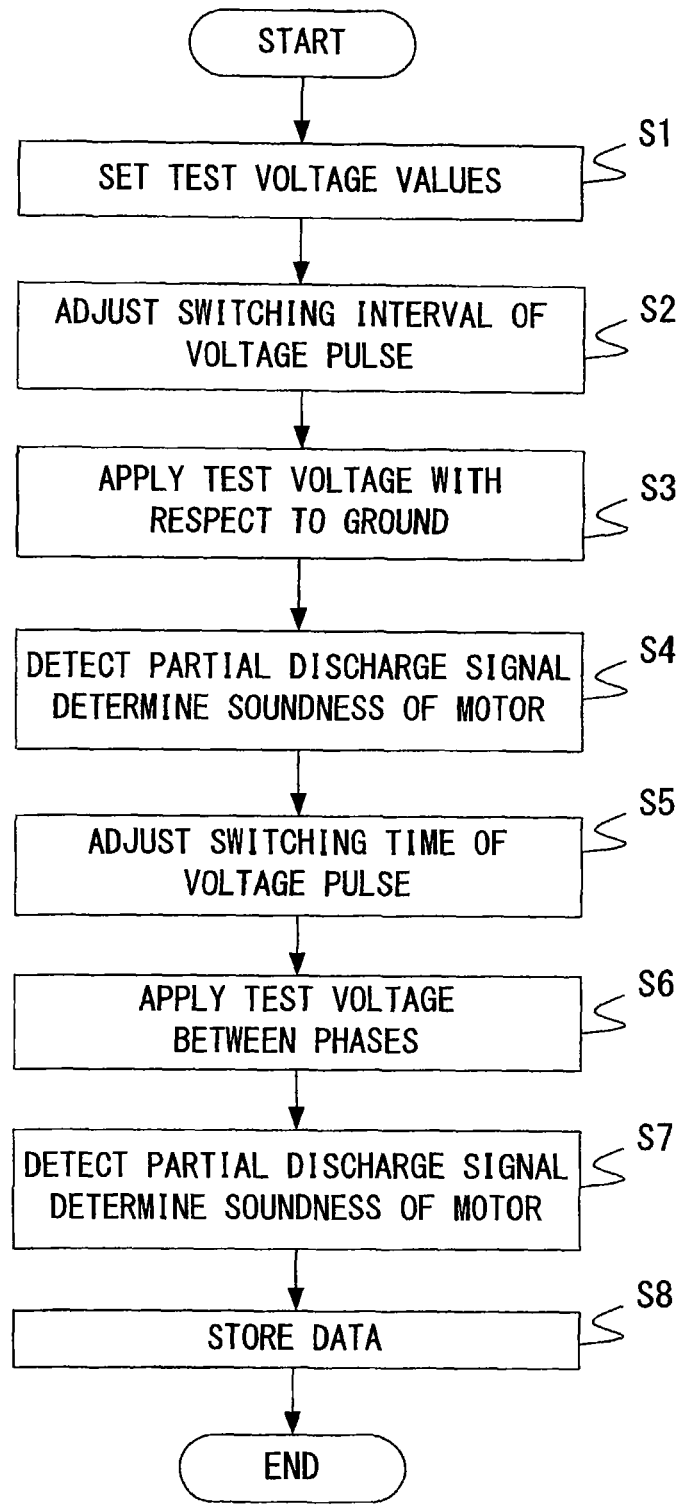
FIG. 14 is a flowchart of an insulation inspection method for motors of embodiment 4 of the present invention.

Hereinafter, embodiment 4 of the present invention will be described based on FIG. 14 which is a flowchart according to the insulation inspection method for motors.

It is noted that the description will be given with reference to FIG. 8 which is the configuration diagram of the insulation inspection device 1 for motors of embodiment 1.

When the process is started, in step 1 (S1), the values of test voltages to be applied between phases and with respect to ground in insulation inspection are determined (test voltage setting step). The test voltages to be applied between phases and with respect to ground are determined in accordance with the specifications and the operation record of a test target motor.

Next, in step 2 (S2), the control circuit 3a adjusts a switching interval of a voltage pulse of the inverter 3 so as to be equal to a pulse round-trip propagation time between the inverter 3 and motor 2, in order to set, to the test voltage determined in step 1, surge voltage that is to be generated between the motor 2 and ground and is higher than surge voltage in driving of the motor 2 (test-voltage-to-ground adjusting step).

Next, in step 3 (S3), the inverter 3 applies the test voltage (surge voltage) determined in step 1 between each of U phase, V phase, and W phase, and ground (test-voltage-to-ground applying step).

Next, in step 4 (S4), the partial discharge detecting unit 6 takes in a signal from the current sensor 7 or/and the antenna 8, detects a partial discharge signal, and determines soundness of the motor with respect to ground (soundness-to-ground determining step).

Next, in step 5 (S5), the control circuit 3a adjusts a switching time for each phase of the inverter 3 in order to set, to the test voltage determined in step 1, surge voltage that is to be generated between phases of the motor 2 and is higher than surge voltage in driving of the motor 2 (phase-to-phase test voltage adjusting step).

Next, in step 6 (S6), the inverter 3 applies the test voltage (surge voltage) determined in step 1 between U and V phases, U and W phases, and V and W phases (phase-to-phase test voltage applying step).

Next, in step 7 (S7), the partial discharge detecting unit 6 takes in a signal from the current sensor 7 or/and the antenna 8, detects a partial discharge signal, and determines soundness of the motor between the phases (phase-to-phase soundness determining step).

Next, in step 8 (S8), data of the test condition and an inspection result are stored (data storing step), and then the process is ended.

As described above, the insulation inspection method for motors according to embodiment 4 includes the test voltage setting step, the test-voltage-to-ground adjusting step, the test-voltage-to-ground applying step, the soundness-to-ground determining step, the phase-to-phase test voltage adjusting step, the phase-to-phase test voltage applying step, the phase-to-phase soundness determining step, and the data storing step. In the insulation inspection method for motors, the control circuit adjusts a switching interval of the inverter so as to be equal to a pulse round-trip propagation time between the inverter and the motor, thereby generating voltage to ground higher than surge voltage in driving, and in addition, adjusts a switching time for each phase of the inverter, thereby generating phase-to-phase voltage higher than surge voltage in driving of the motor, thus performing insulation inspection. Therefore, it is possible to easily detect insulation deterioration of a motor at an early stage by applying voltage equal to or higher than driving voltage for the motor, without the need of a dedicated inspection device.

Embodiment 5

In embodiment 5, a dedicated inverter for motor insulation inspection is used as the inverter. Hereinafter, the configuration and operation of an insulation inspection device 40 for motors of embodiment 5 will be described focusing on a difference from the insulation inspection device 30 for motors of embodiment 3, based on FIG. 15 which is a configuration diagram of the insulation inspection device 40 for motors.

Figure 15:
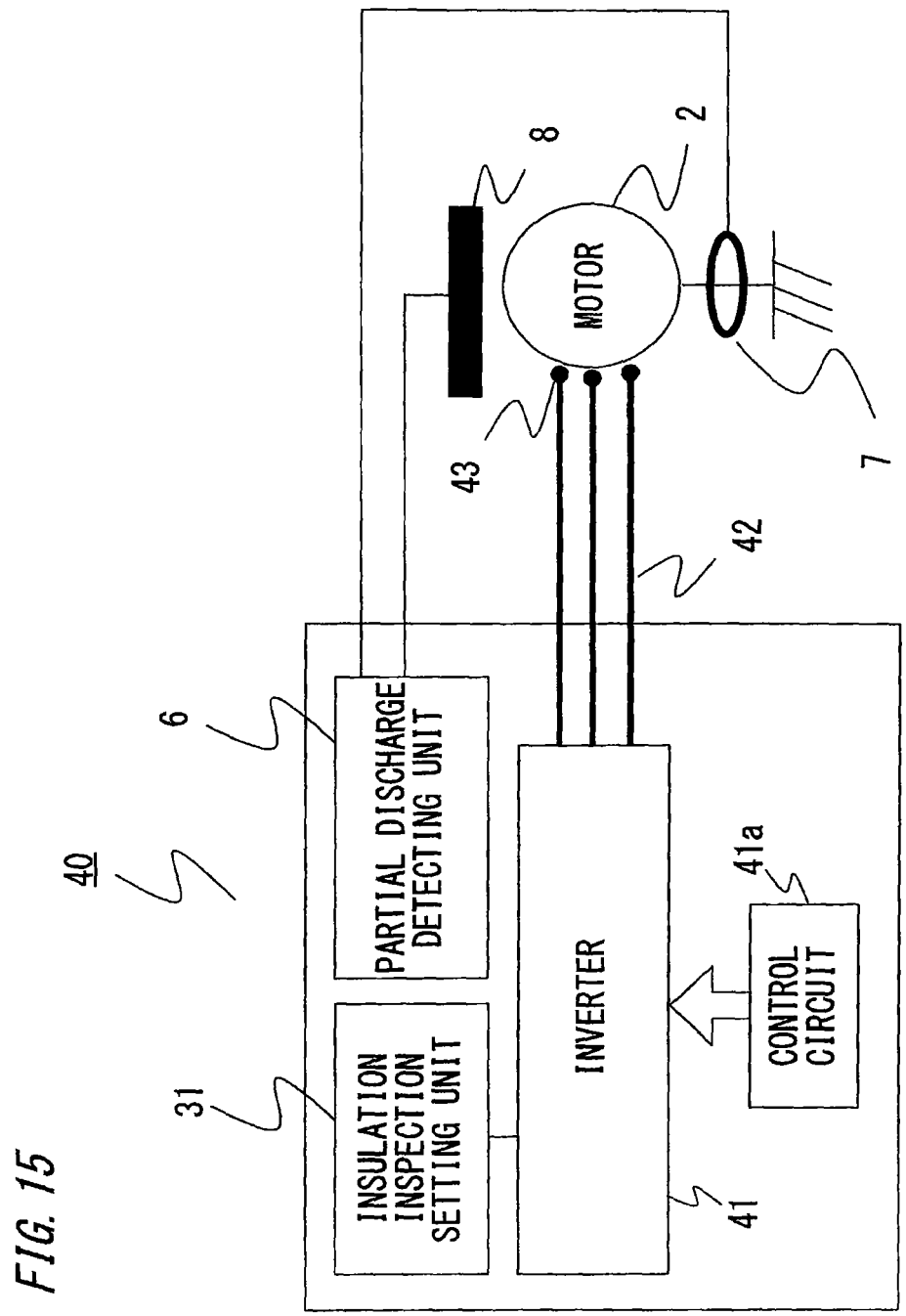
FIG. 15 is a configuration diagram according to an insulation inspection device for motors of embodiment 5 of the present invention.

In FIG. 15, components that are the same as or correspond to those in FIG. 13 are denoted by the same reference characters.

The difference between the insulation inspection device 40 for motors of embodiment 5 and the insulation inspection device 30 for motors of embodiment 3 is that, in embodiment 3, insulation inspection is performed using an inverter for driving a motor, but in embodiment 5, a dedicated inverter for motor insulation inspection is used.

In FIG. 15, an insulation inspection system for motors is composed of the insulation inspection device 40 for motors and the motor 2 which is an insulation inspection target. The insulation inspection device 40 for motors is composed of a dedicated inverter 41 for motor insulation inspection, a control circuit 41a for controlling the inverter 41, a cable 42 for inspection, which connects the dedicated inverter 41 for motor insulation inspection and the motor 2, the partial discharge detecting unit 6 for determining soundness of the motor 2, and the insulation inspection setting unit 31 for automatically performing insulation inspection.

Here, the control circuit 41a drives the motor 2 by the dedicated inverter 41 for motor insulation inspection and generates test voltage (surge voltage) for insulation inspection. The cable 42 for inspection has, at a motor 2 side end thereof, a connection terminal 43 to be connected with the motor 2 when insulation inspection is performed.

The insulation inspection device 40 for motors of embodiment 5 tests one by one a plurality of motors that are insulation inspection targets, using one dedicated inverter 41 for motor insulation inspection.

For example, if the connection terminal 43 of the cable 42 for inspection is movable, it is possible to automatically connect the insulation inspection device 40 for motors and a motor that is an insulation inspection target, thereby enabling effective insulation inspection.

For adjustment of test voltage for a motor, the methods described in embodiments 1, 2, and 3 are used. That is, the control circuit 41a adjusts a switching interval of the dedicated inverter 41 for motor insulation inspection so as to be equal to a pulse round-trip propagation time between the inverter and the motor, thereby generating voltage to ground up to three times higher than driving voltage for the motor, higher than surge voltage in driving, thus performing insulation inspection. In addition, the control circuit 41a adjusts a switching time for each phase of the inverter, thereby generating phase-to-phase voltage up to three times higher than driving voltage for the motor, higher than surge voltage in driving of the motor, thus performing insulation inspection.

Since the insulation inspection device 40 for motors has the insulation inspection setting unit 31, the insulation inspection device 40 for motors can automatically perform insulation inspection as described in embodiment 3. That is, the insulation inspection device 40 for motors can store data of driving voltage for a motor, the pulse round-trip propagation time between the inverter and the motor, and a procedure of the inspection, and when performing insulation inspection, the insulation inspection device 40 for motors reads the stored data, and thereby can automatically perform insulation inspection using specified test voltage (surge voltage). Particularly, it is possible to effectively perform insulation inspection for a motor having specifications for which there is a record of insulation inspection and the inspection data is stored.

It is noted that the specifications of the dedicated inverter 41 for motor insulation inspection need not be the same as the specifications of the inverter for driving a test target motor. In addition, in order to change the magnitude of surge, test may be performed using a cable length different from that at the time of motor installation.

Embodiment 5 has described the configuration in which the dedicated inverter for motor insulation inspection is used as the inverter of the insulation inspection device for motors of embodiment 3. However, the dedicated inverter for motor insulation inspection may be used as the inverter of the insulation inspection device for motors of embodiment 1 or 2.

In addition, the dedicated inverter for motor insulation inspection may be used in the insulation inspection method for motors described in embodiment 4.

In this case, in the insulation inspection method for motors, the control circuit 41a adjusts a switching interval of the inverter so as to be equal to a pulse round-trip propagation time between the inverter and the motor in order to generate voltage to ground higher than surge voltage in driving, thus performing insulation inspection. In addition, the control circuit 41a adjusts a switching time for each phase of the inverter in order to generate phase-to-phase voltage higher than surge voltage in driving of the motor, thus performing insulation inspection.

As described above, the insulation inspection device for motors of embodiment 5 uses a dedicated inverter for motor insulation inspection as the inverter. Therefore, the insulation inspection device for motors of embodiment 5 can efficiently test one by one a plurality of motors that are insulation inspection targets, using one dedicated inverter for motor insulation inspection. Since the insulation inspection is automated, the insulation inspection can be performed further efficiently.

It is noted that, within the scope of the present invention, each of the above embodiments may be modified or abbreviated as appropriate.

INDUSTRIAL APPLICABILITY

Since the present invention can easily detect insulation deterioration of a motor at an early stage by applying voltage equal to or higher than driving voltage for the motor, without the need of a dedicated inspection device, the present invention is applicable to a wide range of inverter-driven motors.

The invention claimed is:

1. An insulation inspection device for motors comprising:
an inverter that drives a motor;
a partial discharge detector that detects partial discharge in the motor and determines soundness of the motor; and
a control circuit that controls the inverter to adjust a switching interval of a voltage pulse so as to be equal to or smaller than a pulse round-trip propagation time between the inverter and the motor, thereby generating surge voltage equal to or lower than three times and equal to or higher than two times a normal driving voltage for the motor, between the motor and ground.

2. The insulation inspection device for motors according to claim 1, wherein the control circuit includes a circuit that adjusts a rising time of the voltage pulse of output of the inverter, and adjusts the rising time of the voltage pulse, thereby generating surge voltage higher than the normal driving voltage for the motor.

3. The insulation inspection device for motors according to claim 1, further comprising an insulation inspection setting unit that stores data of the normal driving voltage for the motor, the pulse round-trip propagation time between the inverter and the motor, and an inspection procedure, and that, at a time of insulation inspection, reads the stored data and preforms the insulation inspection using a specified test voltage.

4. The insulation inspection device for motors according to claim 1, wherein the partial discharge detector includes an antenna that detects a partial discharge signal from an electromagnetic wave radiated from the motor.

5. The insulation inspection device for motors according to claim 1, wherein the partial discharge detector includes a current sensor that detects a partial discharge signal from partial discharge current of the motor.

6. The insulation inspection device for motors according to claim 1, wherein the inverter is a dedicated inverter for motor insulation inspection.

7. An insulation inspection device for motors comprising:
an inverter for driving a motor;
a partial discharge detector that detects partial discharge in the motor and determines soundness of the motor; and
a control circuit that controls the inverter and adjusts a switching time for each phase of the inverter so that the switching times are simultaneous or shifted from each other, thereby generating surge voltage equal to or lower than three times and equal to or higher than two times a normal driving voltage for the motor, between phases of the motor.

8. The insulation inspection device for motors according to claim 7, wherein the control circuit includes a circuit that adjusts a rising time of the voltage pulse of output of the inverter, and adjusts the rising time of the voltage pulse, thereby generating surge voltage higher than the normal driving voltage for the motor.

9. The insulation inspection device for motors according to claim 7, further comprising an insulation inspection setting unit that stores data of the normal driving voltage for the motor, the pulse round-trip propagation time between the inverter and the motor, and an inspection procedure, and that, at a time of insulation inspection, reads the stored data and performs the insulation inspection using specified test voltage.

10. The insulation inspection device for motors according to claim 7, wherein the partial discharge detector includes an antenna that detects a partial discharge signal from an electromagnetic wave radiated from the motor.

11. The insulation inspection device for motors according to claim 7, wherein the inverter is a dedicated inverter for motor insulation inspection.

12. An insulation inspection device for motors comprising:
an inverter that drives a motor;
a partial discharge detector that detects partial discharge in the motor and determines soundness of the motor; and
a control circuit that controls the inverter and adjusts the switching interval of the voltage pulse for each phase of the inverter so as to be equal to or smaller than the pulse round-trip propagation time, and reverses positive and negative polarities of the voltage pulses between the phases, thereby generating surge voltage equal to or lower than five times and equal to or higher than two times a normal driving voltage for the motor, between the phases of the motor.

13. The insulation inspection device for motors according to claim 12, wherein the control circuit includes a circuit that adjusts a rising time of the voltage pulse of output of the inverter, and adjusts the rising time of the voltage pulse, thereby generating surge voltage higher than the normal driving voltage for the motor.

14. The insulation inspection device for motors according to claim 12, further comprising an insulation inspection setting unit that stores data of the normal driving voltage for the motor, the pulse round-trip propagation time between the inverter and the motor, and an inspection procedure, and that, at a time of insulation inspection, reads the stored data and performs the insulation inspection using a specified test voltage.

15. The insulation inspection device for motors according to claim 12, wherein the partial discharge detector includes a current sensor that detects a partial discharge signal from partial discharge current of the motor.

16. The insulation inspection device for motors according to claim 12, wherein the inverter is a dedicated inverter for motor insulation inspection.

17. An insulation inspection method for motors, using an insulation inspection device for motors including an inverter that drives a motor, a partial discharge detector that determines soundness of the motor, and a control circuit that controls the inverter, the insulation inspection method comprising:
setting a value of test voltage to be applied to the motor;
adjusting, by the control circuit, a switching interval of a voltage pulse of the inverter so as to be equal to or smaller than a pulse round-trip propagation time between the inverter and the motor, in order to set, to the test voltage, surge voltage that is to be generated between the motor and ground and is equal to or lower than three times and equal to or higher than two times a normal driving voltage for the motor;
applying, by the inverter, the test voltage between each phase and ground; and
detecting, by the partial discharge detector, a partial discharge signal and determining soundness of the motor with respect to ground.

18. The insulation inspection method for motors according to claim 17, using the insulation inspection device for motors in which the inverter is a dedicated inverter for motor insulation inspection.

19. An insulation inspection method for motors, using an insulation inspection device for motors including an inverter for driving a motor, a partial discharge detecting unit for determining soundness of the motor, and a control circuit for controlling the inverter, the insulation inspection method comprising:
setting a value of test voltage to be applied to the motor;
adjusting, by the control circuit, a switching time for each phase of the inverter so that the switching times are simultaneous or shifted from each other in order to set, to the test voltage, surge voltage that is to be generated between phases of the motor and is equal to or lower than three times and equal to or higher than two times a normal driving voltage for the motor;
applying, by the inverter, the test voltage between the phases, and
detecting, by the partial discharge detecting unit, a partial discharge signal and determining phase-to-phase soundness of the motor.

20. The insulation inspection method for motors according to claim 19, using the insulation inspection device for motors in which the inverter is a dedicated inverter for motor insulation inspection.

* * * * *